(12) United States Patent
Nishiyama (10) Patent No.: US 7,620,332 B2
(45) Date of Patent: Nov. 17, 2009

(54) OPTICAL RECEIVING UNIT REDUCING CROSS TALK BETWEEN OPTICAL TRANSMITTING UNIT AND OPTICAL TRANSMITTING/RECEIVING APPARATUS INSTALLING THE SAME

(75) Inventor: Naoki Nishiyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 551 days.

(21) Appl. No.: 11/128,915

(22) Filed: May 12, 2005

(65) Prior Publication Data

US 2006/0002720 A1  Jan. 5, 2006

(30) Foreign Application Priority Data

May 14, 2004  (JP)  ............................ 2004-145319

(51) Int. Cl.
*H04B 10/06* (2006.01)
(52) U.S. Cl. .................. 398/202; 398/206; 398/208; 398/209; 398/140
(58) Field of Classification Search .............. 398/202, 398/206, 209, 214, 208, 135; 330/59; 250/214 A, 250/338.1
See application file for complete search history.

(56) References Cited

U.S. PATENT DOCUMENTS

| | | | |
|---|---|---|---|
| 3,436,559 A * | 4/1969 | Wajs | 327/334 |
| 5,539,779 A * | 7/1996 | Nagahori | 375/317 |
| 6,288,604 B1 * | 9/2001 | Shih et al. | 330/9 |
| 6,608,710 B1 * | 8/2003 | Battagin | 398/209 |
| 7,382,987 B2 | 6/2008 | Misaizu et al. | |
| 7,417,230 B2 * | 8/2008 | Anderson et al. | 250/338.1 |
| 7,460,788 B2 * | 12/2008 | Schrodinger et al. | 398/135 |
| 2003/0194244 A1 * | 10/2003 | Doh et al. | 398/202 |
| 2004/0056181 A1 * | 3/2004 | Ono | 250/214 R |
| 2004/0075484 A1 * | 4/2004 | Nishizono et al. | 327/345 |

FOREIGN PATENT DOCUMENTS

| | | |
|---|---|---|
| JP | 07-162186 | 6/1995 |
| JP | 08-330655 | 12/1996 |
| JP | 2000-134160 | 5/2000 |
| JP | 2000-357803 | 12/2000 |
| JP | 2005-117464 | 4/2005 |

* cited by examiner

*Primary Examiner*—Ken N Vanderpuye
*Assistant Examiner*—Hilbret A Woldekidan
(74) *Attorney, Agent, or Firm*—Fish & Richardson P.C.

(57) ABSTRACT

The present invention provides an optical transceiver to reduce a crosstalk in sufficient. The optical receiving unit of the invention includes an O/E-converter, a signal processing unit, and an offset voltage setting unit. The input of the signal processing unit, connected to the output of the O/E-converter, receives an electrical signal from the O/E-converter. The offset voltage $V_{OFF}$ of the signal processing unit is kept constant, independent of the phase difference between signal in the optical transmitting unit and in the optical receiving unit, by the offset voltage setting unit.

7 Claims, 6 Drawing Sheets

OPTICAL RECEIVING UNIT REDUCING CROSS TALK BETWEEN OPTICAL TRANSMITTING UNIT AND OPTICAL TRANSMITTING/RECEIVING APPARATUS INSTALLING THE SAME

BACKGROUND OF THE INVENTION

1. Field of the Invention

The present invention relates to an optical transceiver.

2. Related Prior Art

Japanese Patent Application publish as H08-330655 has disclosed a driver circuit for a laser diode (LD) configured with a differential circuit driven by a current source. This LD driver circuit configures one output terminal to a positive power supply via an output bias coil and to the laser diode via a coupling capacitor. This output also connects an impedance circuit in parallel to an antiresonant circuit of a parasitic inductance inherently attributed to the LD and a stray capacitance connected in parallel to the parasitic inductance. This impedance circuit dulls an overshoot and an undershoot that are appeared in the optical output of the LD near the resonant frequency attributed to the parasitic inductance of the LD and the stray capacitance.

Another Japanese Patent Application published as H07-162186 has disclosed an optical transceiver that prevents the interference of the optical transmitting unit with the optical receiving unit, consequently the optical sensitivity from degrading. The optical transceiver includes a multi-layered printed circuit board, an lower case for mounting the multi-layered printed circuit board, and an upper case for enclosing, cooperating with the lower case, the printed circuit board. On the side wall of the lower case is installed with an optical transmitting module and an optical receiving module. The printed circuit board has a first region to install the transmitting circuit and a second region to install the receiving circuit. Between the first and second regions is provided with a first shield plate fixed to the lower case and a second shield plate fixed to the upper case. Accordingly, the crosstalk between the transmitting circuit and the receiving circuit may be reduced.

Still another Japanese Patent Application published as 2000-357803 has disclosed an optical data link. This data link comprises a receptacle, optical transmitting/receiving modules, a plastic package, and a shield case. The shield case prevents a noise radiating from the inside of the data link to the outside and another noise coming from the outside into the data link. Moreover, an existing lead pin realizes the connection to this shield case. This data link, even providing the shield case, does not degrade the optical coupling between the fiber and the light-emitting device or between the fiber and the light-receiving device. This data link provides a cover for the optical transmitting module for shielding which reduces the crosstalk. That is, this data link provides the cover in the transmitting module to protect the receiving module that is intolerant of the noise compared to the optical transmitting unit.

Thus, recent optical data links has a configuration to decrease the noise affecting the optical receiving unit to enhance the receiver sensitivity. In the meantime, the optical transceiver is requested to be small as possible. Therefore, one aspect of the present invention is to provide an optical transceiver capable of reducing the crosstalk induced to the optical receiving unit.

SUMMARY OF THE INVENTION

An optical receiving unit according to the present invention receives an optical signal and outputs an electrical output signal corresponding to the optical signal, which may be installed on an optical transceiver or on an optical data link. The optical receiving unit includes an O/E-converter, a signal processing unit, and an offset voltage setting unit. The O/E-converter receives the optical signal and generates an electrical signal corresponding to the optical signal. The signal processing unit provides an input and an output. The input receives the electrical signal output from the O/E-converter. The electrical output signal is led from the output of the signal processing unit. The offset voltage setting unit sets an offset voltage to the input of the signal processing unit and keeps the offset voltage constant.

In the optical receiving unit of the present invention, the predetermined bias voltage is set in the input of the signal processing unit and is kept constant. Accordingly, the receiving unit can escape from the crosstalk attributed to the transmitting unit and keep the bit error rate of the receiving unit quite low.

The O/E-converter can couple in alternating current with the signal processing unit via a capacitor, whereby the bias voltage applied to the input of the signal processing unit can be optionally set independent of the output level of the O/E-converter.

The O/E-converter may include a light-receiving device, for receiving the optical signal and outputting a photocurrent, and a trans-impedance amplifier, for converting this photocurrent into the electrical signal. The electrical signal is preferable to be a differential signal including two signals with phases complementary to each other, and the trans-impedance amplifier may configure the differential amplifier to output this complementary signal. The input of the signal processing unit may provide the differential configuration with first and second inputs to receive the complementary signal. The offset voltage setting unit may also provide the differential configuration to set the offset voltage, as the bias voltage, between the first and second inputs.

To configure the O/E-converter, the signal processing unit, and the offset voltage setting unit to be the differential circuit may stabilize the operation of the circuit for the high speed optical signal. Moreover, to set the faint offset voltage may keep the bit error rate of the signal processing unit quite low.

The offset voltage may be provided to the input of the signal processing unit from the offset voltage setting unit through a resistor. This resistor may be a part of a feedback element connected between the output and input of the signal processing unit, which simplifies the circuit configuration of the signal processing unit.

The offset voltage setting unit may include first and second amplifiers with a configuration that each input is connected to the output of the other. The first amplifier may configure the low pass filter. The input of the first amplifier, i.e., the output of the second amplifier, may be connected to the input of the signal processing unit, which detects the average offset appeared in the input of the signal processing unit and, in the same time, keeps this offset voltage a predetermined value by the offset voltage setting unit.

Moreover, the input of the second amplifier may receive a bias voltage that depends on an operation temperature of the optical receiving unit, which compensates in temperature the offset voltage output to the signal processing unit. By preparing a look-up-table relating the bias voltage to the temperature, and providing the bias voltage based on the monitored operating temperature and this look-up-table, the offset voltage output from the offset voltage setting unit may be a temperature compensated data.

Still further, in an optical transceiver installing the optical receiving unit according to the present invention, the bit error rate of the receiving unit can be kept low in stable independent of the phase difference between signals in the optical transmitting unit and in the optical receiving unit. In specific, by setting the predetermined offset voltage to the input of the signal processing unit, the bit error rate of the receiving unit can be kept in a low rate.

DETAILED DESCRIPTION OF PREFERRED EMBODIMENTS

The present invention will be easily understood through the detailed description provided below as referring to accompanying drawings. Next, the optical transceiver according to the present invention will be described as referring to drawings. If possible, the same numerals or the same symbols will refer the same elements.

First Embodiment

Figure 1:
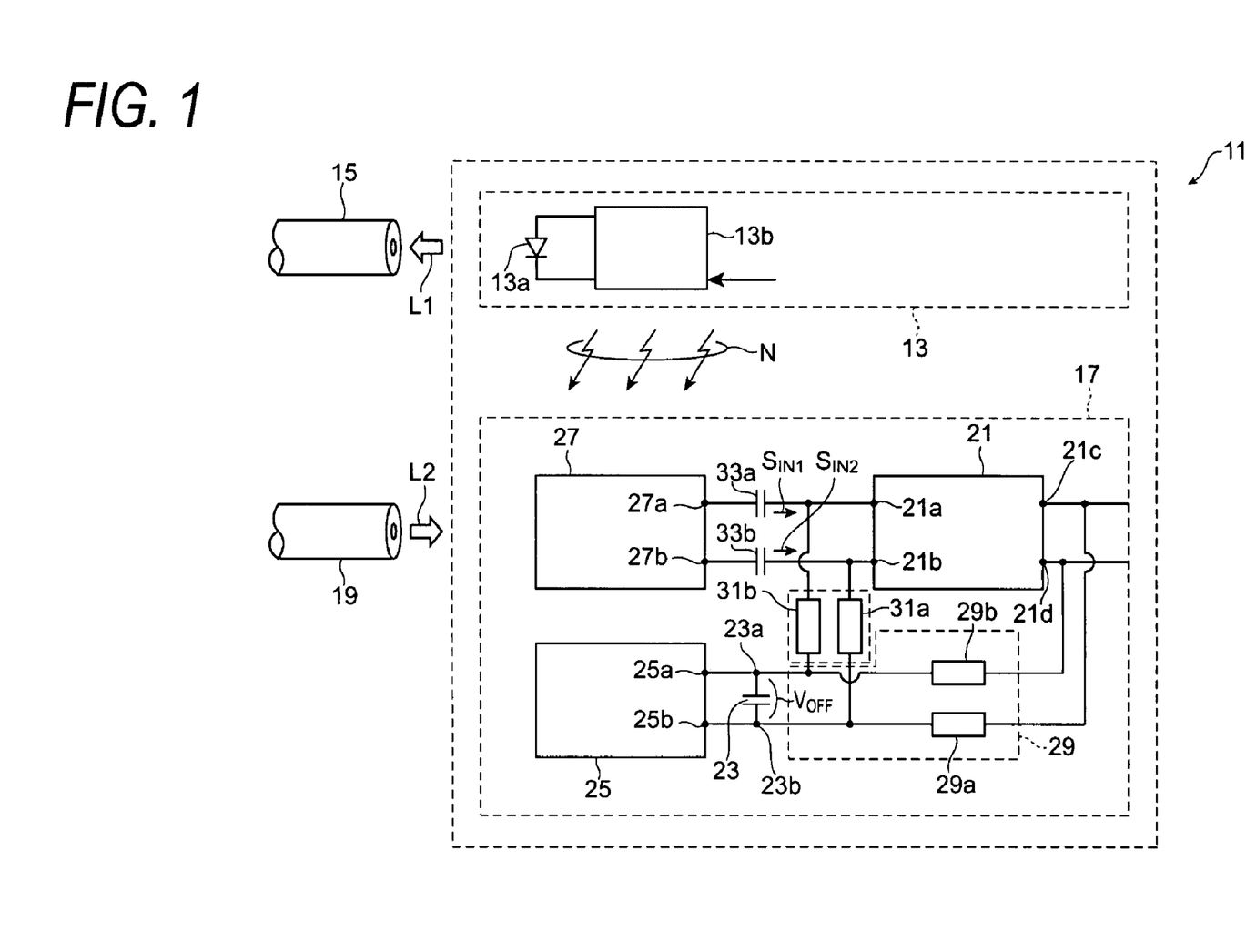
FIG. 1 is a schematic diagram showing an optical transceiver according to the first embodiment of the invention.

FIG. 1 is a schematic diagram of an optical transceiver according to the first embodiment of the invention. The optical transceiver 11 comprises an optical transmitting unit 13 and an optical receiving unit 17. The optical transmitting unit 13 generates signal light L1 to be provided into an optical fiber 15. The optical transmitting unit 13 includes a laser diode (LD) 13a and a driver 13b for driving the LD 13a. The drive 13b is necessary to switch a large current to drive the LD 13a and to generate the signal light L1. This switching of the driver 13b inevitably generates a noise N, a portion of which is transmitted to the optical receiving unit 17 via the power line or is radiated thereto via the space within the optical transceiver. The optical receiving unit 17 receives signal light L2 from an optical fiber 19, and comprises an O/E-converter 27, a signal processing unit 21, a capacitor 23, and an offset voltage setting unit 25.

The signal processing unit 21 has a pair of inputs, 21a and 21b, and a pair of outputs, 21c and 21d. The O/E-converter 27, receiving the signal light L2, generates two signals, $S_{IN1}$ and $S_{IN2}$, that corresponds to the signal light L2 and are complementary to each other. The paired inputs, 21a and 21b, of the signal processing unit 21, which are connected to the paired outputs, 27a and 27b, of the O/E-converter 27, receives the differential signal, $S_{IN1}$ and $S_{IN2}$. The signal processing unit 21 amplifies the differential signal, $S_{IN1}$ and $S_{IN2}$, and outputs thus amplified differential signal to the paired outputs, 21c and 21d. The offset voltage setting unit 25 provides an offset voltage, which is independent of the phase difference between the transmitting signal propagating within the optical transmitting unit 13 and the receiving signal propagating within the optical receiving unit 17. The capacitor 23, having two terminals, 23a and 23b, each connected to the paired inputs, 21a and 21b, of the signal processing unit 21, holds the offset voltage $V_{OFF}$ appeared between the terminals, 23a and 23b. This offset voltage $V_{OFF}$ is applied to the paired inputs, 21a and 21b. The offset voltage setting unit 25 provides first and second inputs, 25a and 25b, respectively, they are connected to each terminals, 23a and 23b, of the capacitor, and an output 25c connected to the input, 23b, to set the offset voltage $V_{OFF}$.

The signal processing unit 21 further provides a feedback 29 connected between the paired inputs, 21a and 21b, and the paired outputs, 21c and 21d, and also connected to the terminals, 23a and 23b, of the capacitor 23. The feedback 29 includes two resistors, 29a and 29b, one 29a of which is connected between the output 21c and the input 21b via the third resistor 31b, the other 29b of which is connected between the output 21d and the input 21a via the fourth resistor 31b. Operating this optical transceiver 11, the input offset voltage, in particular, the input offset voltage of the signal processing unit drifts due to the crosstalk between the optical transmitting unit 13 to the optical receiving unit 17, which degrades the optical sensitivity of the transceiver.

The crosstalk is caused by the noise N derived from the optical transmitting unit leaking to the optical receiving unit and degrading the waveform of the signal. Consequently, the signal-to-noise ratio, which is denoted by S/N, degrades. When the noise N from the optical transmitting unit 13 is a random noise, which is asynchronous to the receiving signal within the optical receiving unit 17, the S/N degrades due to the crosstalk, the magnitude of which is proportional to the average power of the noise N. When the noise N is synchronous to the receiving signal in the optical receiving unit 17, the receiving signal $S_X$, which is assumed to include the crosstalk noise, is expressed as:

$$S_x = A * \cos(\text{OMEGA} * t) * [1 + M * \cos(\text{OMEGA} * t + \text{PHI})]$$
$$= A * \cos(\text{OMEGA} * t) + A * M/2 * \cos(2 * \text{OMEGA} * t) +$$
$$A * M/2 * \cos(\text{PHI}).$$

Where, $S_0 = A*\cos(\text{OMEGA}*t)$ is the receiving signal, PHI is a phase difference between the optical transmitting unit and the optical receiving unit, and M is a coupling constant of the crosstalk between the units.

In the case that the signal processing unit 21 provides the feedback 29 to cancel the input offset thereof, it is often configured to feedback the integral, i.e., the average of the output of the signal processing unit 21 to the input for the reverse phase in order to compensate the input offset voltage. When no crosstalk has occurred between two units of the optical transceiver, which corresponds to M=0 in the above equation, the integral of the receiving signal $S_X$ becomes zero. When the crosstalk has occurred, the integral of the receiving signal $S_X$ becomes substance of $A*M/2*\cos(\text{PHI})$.

That is, the offset voltage of $A*M/2*\cos(\text{PHI})$ has caused in the input of the signal processing unit 21 due to the crosstalk. This crosstalk degrades the sensitivity of the optical receiving unit 17. Moreover, the magnitude of the crosstalk depends on the phase difference between the optical transmitting unit 13 and the optical receiving unit 17. When the phase of the receiving signal fluctuates such as the optical signal transmitted in a long distance, in which the phase difference between two units drifts by the time, the offset voltage also fluctuates depending on the fluctuation of the phase difference, which results in the drift of the bit error rate.

To set the phase difference between two units by 90 degrees makes it possible to escape from the crosstalk, because the third member in the equation above presented becomes zero. However, to control the phase is substantially impossible for the optical signal transmitted in a long distance. On the other hand, to provide an offset voltage setting circuit, which provides an offset voltage independent of the phase difference between two units, or, in an ideal case, provides an offset voltage varying as the fluctuation of the phase difference PHI between two units to minimize the bit error rate or to eliminate the crosstalk, may realize the optical transceiver capable of minimizing the crosstalk by eliminating the fluctuation of the phase difference between the receiving signal and the transmitting signal.

Second Embodiment

Figure 2:
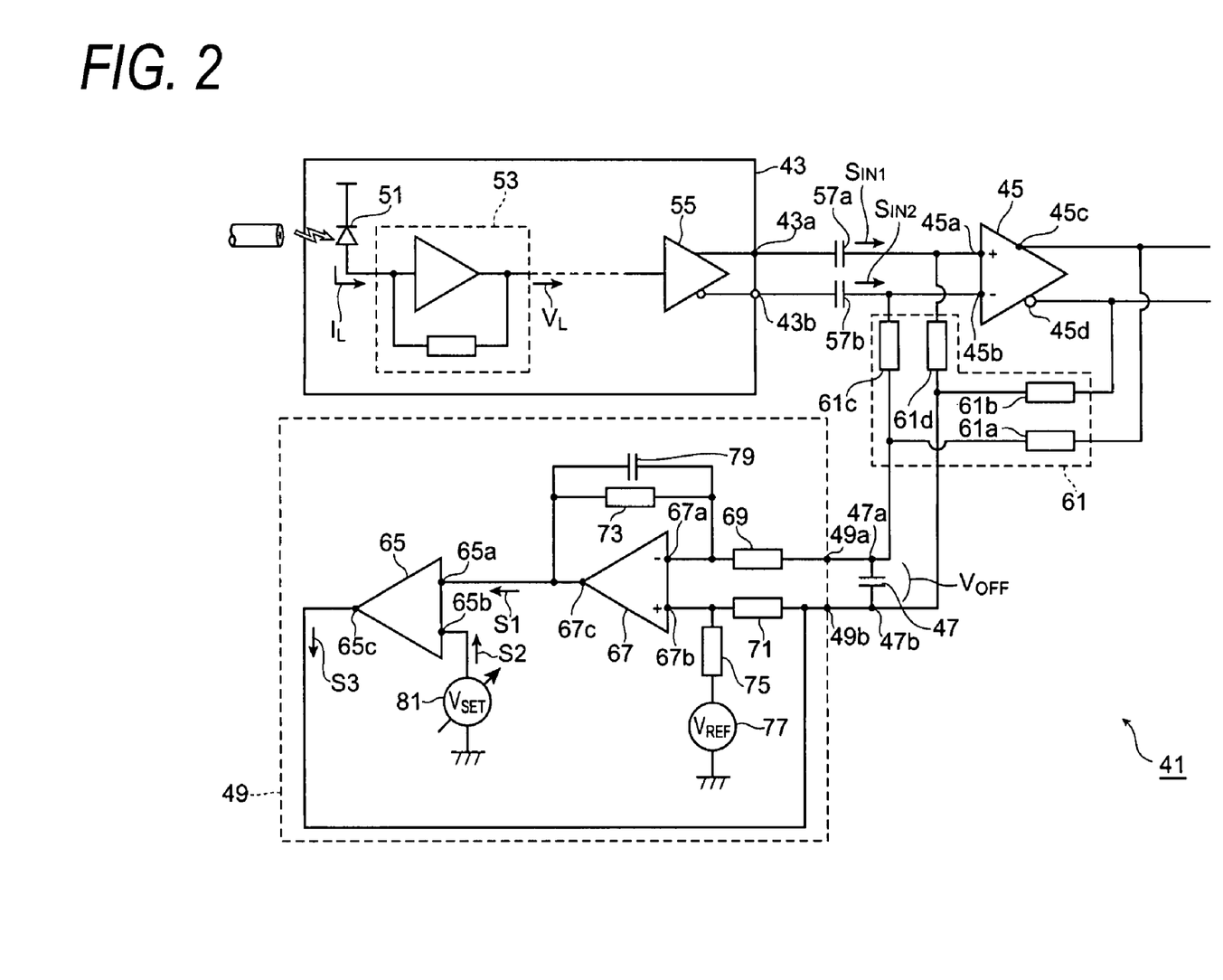
FIG. 2 is a schematic diagram of the light receiving unit according to the second embodiment of the invention.

FIG. 2 is a circuit diagram showing an optical receiving unit according to the second embodiment of the invention, which substantially illustrates the optical receiving unit 17 of the optical transceiver 11 shown in FIG. 1. The optical receiving unit 41 comprises the O/E-converter 43, the signal processing unit 45, the capacitor 47, and the offset voltage setting unit 49. The O/E-converter 43 generates, by receiving the signal light, differential signals, which is complementary to each other and corresponds to the signal light, and outputs these differential signals from the output terminals, 43a and 43b. The O/E-converter 43 includes a light-receiving device 51, a trans-impedance amplifier 53, and an amplifier 55. The trans-impedance amplifier 53 converts the current signal $I_L$ from the light-receiving device 51 to a voltage signal $V_L$. The amplifier 55 amplifies thus converted voltage signal $V_L$ and outputs the differential signals, $S_{IN1}$ and $S_{IN2}$, from the output terminals, 43a and 43b. These output terminals, 43a and 43b, are connected to the inputs, 45a and 45b, of the signal processing unit 45 via capacitors, 57a and 57b. The signal processing unit 45 amplifies the differential signal generated by the amplifier 55, processes the differential signal, and outputs the complementary signal to the outputs, 45c and 45d. The offset voltage setting unit 49 sets the offset voltage to the inputs, 45a and 45b, of the signal processing unit 45. The capacitor 47 with electrodes thereof, 47a and 47b, connected to these inputs, 45a and 45b, respectively, sets the offset voltage VOFF between these two electrodes, 47a and 47b.

Between the paired inputs, 45a and 45b, and the paired outputs, 45c and 45d, are provided with the feedback 61 that includes first and second resistors, 61a and 61b, connected between the two electrodes, 47a and 47b, of the capacitor 47 and the paired outputs, 45c and 45d, and third and force resistors, 61c and 61d, each connected between the electrodes, 47a and 47b of the capacitor 47 and the paired inputs, 45a and 45b, of the signal processing unit 45. Thus, the capacitor 47 is connected to the paired inputs, 45a and 45b, via the third and fourth resistors, 61c and 61d, respectively.

The offset voltage setting unit 49 provides a paired inputs, 49a and 49b, each connected to the electrodes, 47a and 47b, of the capacitor 47, and sets the offset voltage $V_{OFF}$. The offset voltage setting unit 49 includes first and second differential amplifiers, 67 and 65. The input 67a of the first differential amplifier 67 receives a signal from the input 49a via the fifth resistor 69, while the other input 67b, receiving another signal from the other input 49b via the resistor 71, is connected to the reference $V_{REF}$ via the eighth resistor 75. The output 67c of the first differential amplifier 67 is connected to the input 67c thereof via the seventh resistor 73 connected in parallel to a capacitor 79. Accordingly, the first differential amplifier 67 operates as a low-pass filter with a substantial gain.

The second differential amplifier 65 provides the first input 65a to receive the signal S1 from the output 67a of the first differential amplifier 67, the second input 65b to receive the signal S2 corresponding to the reference VSET, and the output 65c connected to the sixth resistor 71 and the input 49b of the offset voltage setting unit 49.

The first differential amplifier 67 amplifies a signal in the low frequency component thereof between two electrodes, 47a and 47b, of the capacitor 47 to output the signal S1 relating to this signal. The second differential amplifier 65, responding to the first signal S1 and the second signal S2, generates a difference signal S3 between these two signals, S1 and S2. This difference signal S3 is fed back to the input 67b of the first differential amplifier. Accordingly, the first and second differential amplifiers operate, as a whole, to eliminate the difference between two inputs, 65a and 65b, of the second differential amplifier 65, so the voltage between electrodes, 47a and 47b, of the capacitor 47 is substantially kept constant. Moreover, the first differential amplifier operates as the low-pass filter, the feedback thus explained is effective for only the average voltage between two electrodes, 47a and 47b, of the capacitor 47.

The optical receiving unit 41 provides a voltage source 81 to generate the reference VSET. It is preferable for the voltage source 81 to be compensated with a temperature, because the signal processing unit 45 may receive the offset voltage $V_{OFF}$ with temperature compensated characteristic. One example to compensate with the temperature, the optical receiving unit 45 may provide a digital-to-analog converter (DAC), which integrates a look-up-table for the temperature compensation, and a temperature sensor. Further, these DAC and the temperature sensor may be controlled by a central processing unit (CPU). Thus, the temperature dependence of the input offset voltage of the signal processing unit 45, which is inherent with the unit, can be compensated.

The offset voltage setting unit 49 shown in FIG. 2 uses a variable voltage source 81. However, the resistive divider from a constant voltage source may generate the reference $V_{SET}$.

The ratio of the fifth resistor 69 (R5) to the seventh resistor 73 (R7) determines the gain of the first differential amplifier 67. The fifth resistor 69 (R5) and the sixth resistor 73 (R7) are, for example, 10 kohm, while the seventh resistor 73 (R7) and the eighth resistor 75 (R8) are 510 kohm. An optimal offset voltage for the signal processing unit 45 shown in FIG. 2 is 2 mV. When the offset voltage is greater than 2 mV, the bit error rate for the data "1" exceeds that for the data "0", that is, the error for judging the data "1" to data "0" becomes larger. On the other hand, when the offset voltage is smaller than 2 mV, the error rate for the data "0" exceeds that for the data "1", that is, the error for judging the data "0" to data "1". Moreover, when the offset voltage is 2 mV, the bit error rate becomes the minimum.

In the present embodiment, the first differential amplifier 67 amplifies this offset voltage with a predetermined gain. The output of the first differential amplifier 67 appears the magnified offset voltage. This magnified offset voltage becomes around 100 mV because the gain of the first amplifier is 51 when the resistance above mentioned is applied as the circuit constant. When the reference $V_{REF}$ from the voltage source 77 is set to 1.25V and the reference $V_{SET}$ from another voltage source 81 is set to 1.35 V, which is 0.1 V added to $V_{REF}$, the optimal offset voltage may be applied between terminals of the capacitor 47.

Figure 3:
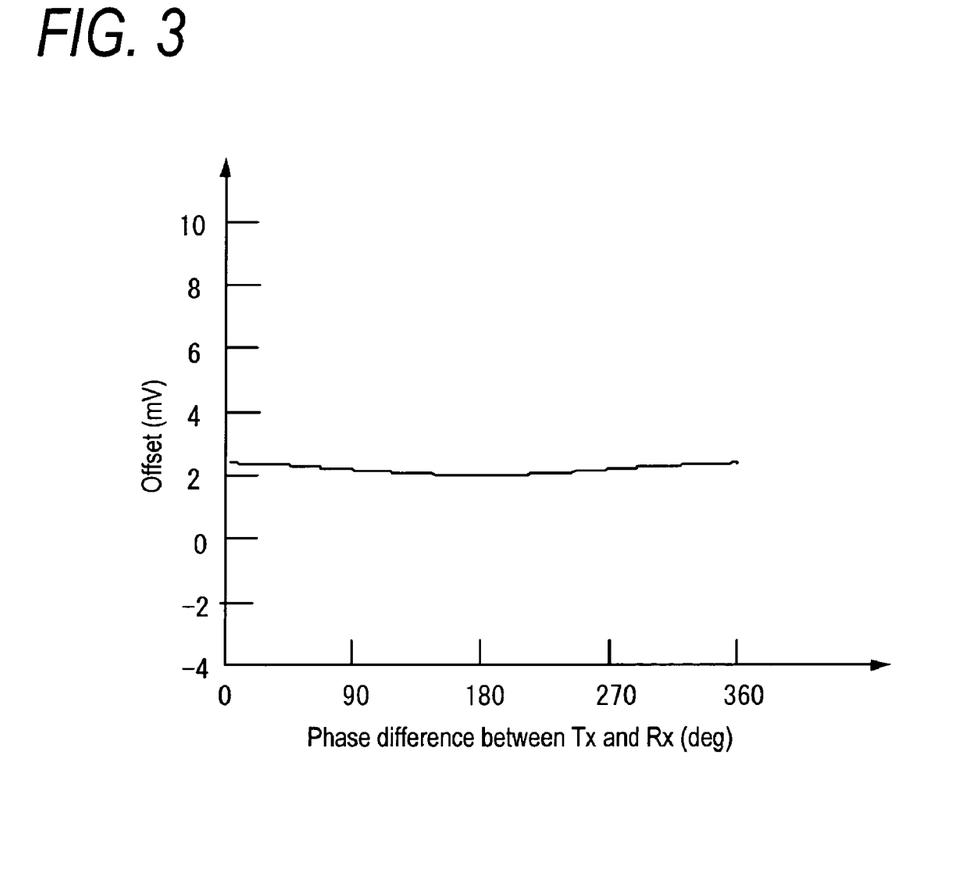
FIG. 3 shows a behavior of the offset voltage of the optical receiving unit that provides the offset voltage setting unit.
Figure 4:
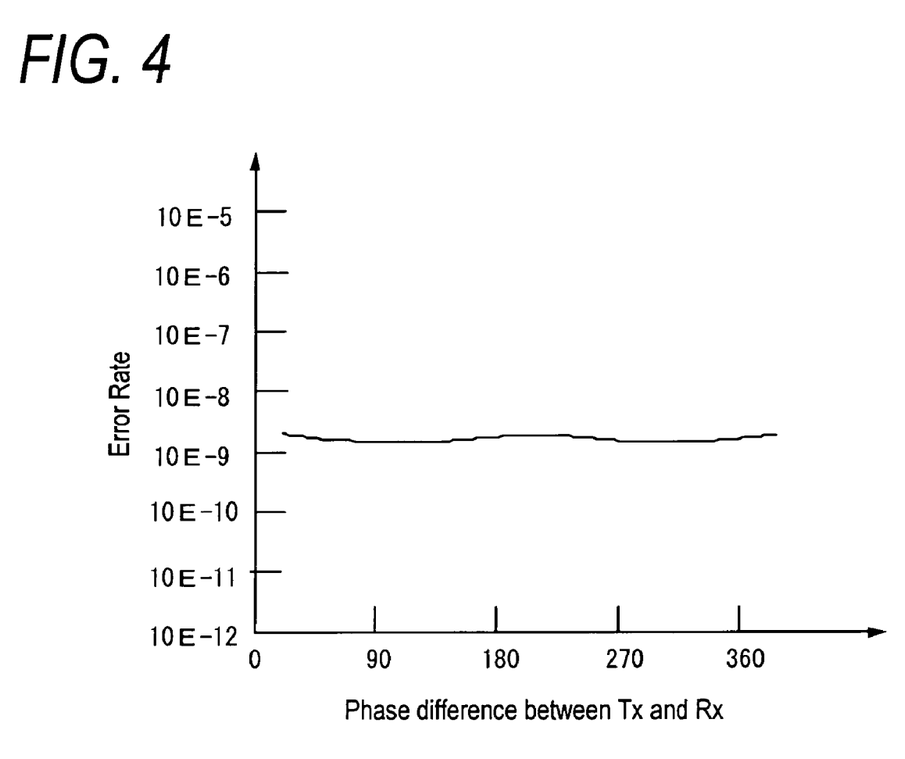
FIG. 4 shows a behavior of the error rate of the optical receiving unit that provides the offset voltage setting unit.

The offset voltage appeared between terminals of the capacitor 47 and the bit error rate of the optical receiving unit 41 are evaluated as the optical signal, modulated by 2.48832 Gb/s and with magnitude of about −35 dBm, is practically input thereto from a light source. FIG. 3 shows the behavior of the offset voltage of the optical receiving unit that provides the offset voltage setting unit, 25 or 49. FIG. 4 shows the bit error rate of the optical receiving unit with the offset voltage setting unit. The horizontal axis in FIG. 3 and FIG. 4 denotes the phase difference between signals within the optical transmitting unit 13 and the optical receiving unit 17. It is understood from these figures that the offset voltage setting unit, 25 and 49, can maintain the offset voltage of the signal processing unit and the bit error rate thereof independent if the phase difference of signals within the optical transmitting unit 13 and the optical receiving unit 17.

Figure 5:
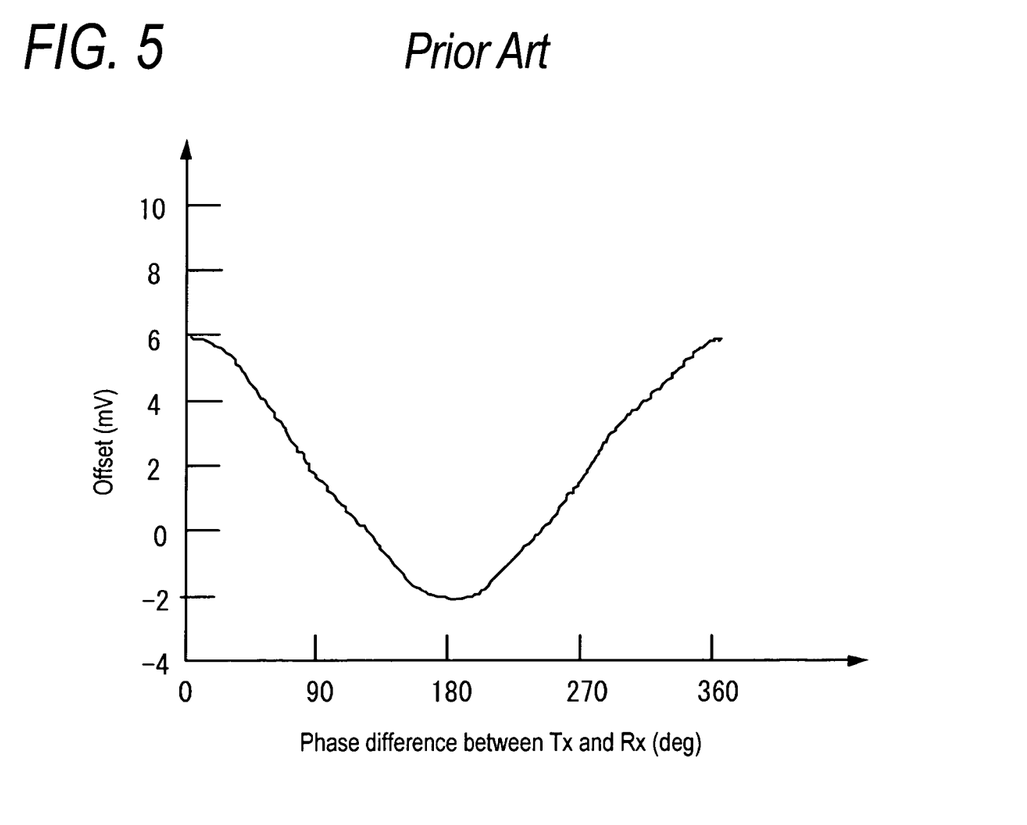
FIG. 5 shows a behavior of the offset voltage of the optical receiving unit that excludes the offset voltage setting unit.
Figure 6:
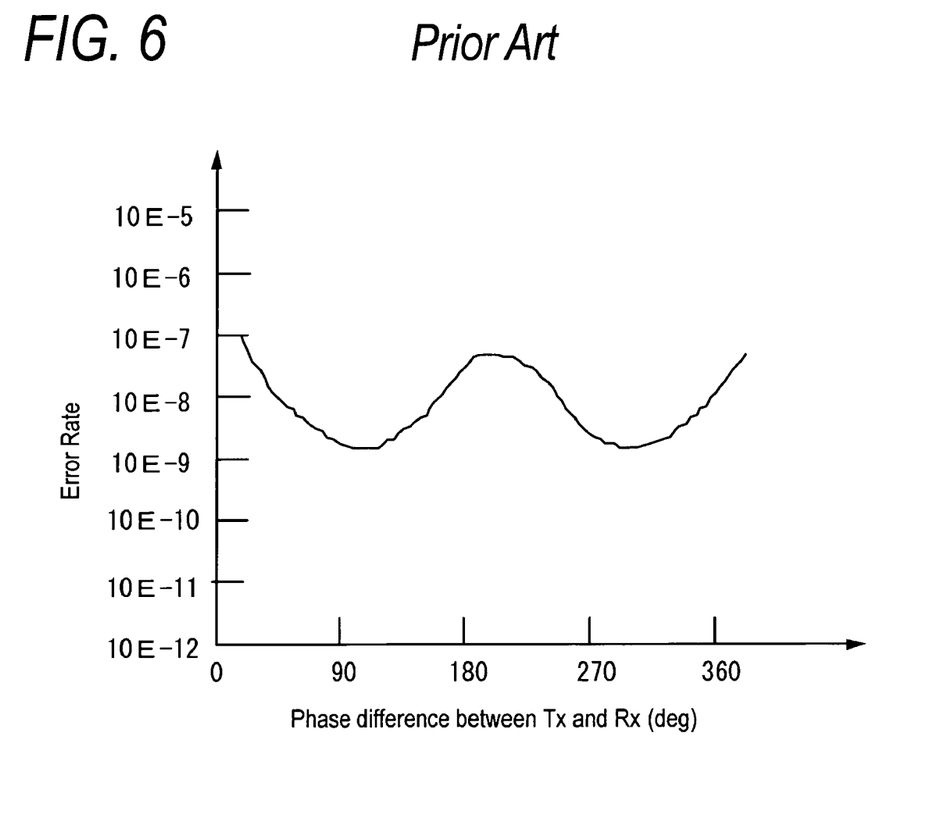
FIG. 6 shows a behavior of the error rate of the optical receiving unit that excludes the offset voltage setting unit.

On the other hand, FIG. 5 shows a behavior of the offset voltage of the signal processing unit in the optical receiving unit that excludes the offset voltage setting of the present invention. FIG. 6 shows a behavior of the bit error rate of the optical receiving unit without the offset voltage setting unit. The horizontal axis in FIG. 5 and FIG. 6 denotes the phase difference between the transmitting unit and the receiving unit. The signal processing unit corresponding to FIGS. 5 and 6 provides the feedback connecting the output to the input thereof to compensate the input offset voltage. The evaluation was performed by practically inputting a signal light modulated by 2.48832 Gb/s with −35 dBm and measured the offset voltage appeared between electrodes of the capacitor, 23 or 47, and the bit error rate of the optical receiving unit.

The offset voltage becomes 2 mV when the optical transmitting unit does not operate. While the offset voltage increases to 5 mV when the optical receiving unit receives the signal light under the condition that the signal transmitting unit operates. Moreover, the offset voltage drifts as the phase difference between the transmitting unit and the receiving unit varies. As shown in FIG. 5 and FIG. 6, the bit error rate becomes a minimum when the offset voltage becomes around 2 mV.

In the optical transceiver or in the optical receiving unit, the signal in the optical receiving unit involves both components, synchronous and asynchronous, to that in the optical transmitting unit. The asynchronous component becomes the crosstalk that degrades the S/N of the optical receiving unit. The synchronous component causes the degradation in the optical sensitivity because the offset voltage of the signal processing unit varies depending on the phase difference between the optical transmitting unit and the optical receiving unit. The optical transmitting unit and the receiving unit according to the present invention reduces the influence derived attributed to the offset voltage by providing the unit to keep the offset voltage of the signal processing unit constant.

When a shield or a shield cover to isolate in electrical the optical receiving unit from the optical transmitting unit is provided, it is ineffective for a noise to propagate through the power line or the ground line. However, the transceiver or the optical receiving unit of the present invention sets the offset voltage of the signal processing unit by the offset voltage setting unit to suppress the degradation of the receiving sensitivity and its fluctuation due to the crosstalk. Accordingly, it is able to suppress the degradation of the bit error rate and the drift thereof due to the noise propagating through the interconnection.

The offset voltage setting unit in the optical receiving unit keeps the offset voltage of the signal processing unit to minimize the crosstalk from the optical transmitting unit. In either case that the optical transmitting unit is independent of the optical receiving unit, or is integrated with the receiving unit, it is unable to distinguish two configurations as far as the function of the present invention.

In the optical receiving unit shown in FIG. 1 and FIG. 2, the O/E-converter, the signal processing unit, and the offset voltage setting unit are assumed to configure the differential signal. However, the function of the present invention is not restricted to the differential signal. That is, the threshold level to judge the data may be adjusted by setting the predefined offset voltage to the signal processing unit, which realizes the judgement of the data with accuracy independent of the phase difference between the receiving unit and the transmitting unit.

Although the present invention has been disclosed in accordance with the embodiments shown, one of ordinary skill in the art will readily recognize that there could be variations to the embodiments shown and those variations would be within the spirit and scope of the present invention. Accordingly, many modifications may be made by one of ordinary skill in the art without departing from the spirit and scope of the appended claims.

What is claimed is:

1. An optical receiving unit for outputting an electrical output signal by receiving an optical signal, the optical receiving unit comprising:

an O/E-converter for receiving said optical signal and outputting an electrical signal corresponding to said optical signal, the O/E-converter including a light-receiving device to receive the optical signal and to output a photocurrent, and including a trans-impedance amplifier to convert the photocurrent into the electrical signal;

a signal processing unit having an input coupled in an AC mode with the O/E-converter through a capacitor for receiving said electrical signal and an output for outputting said electrical output signal, wherein the input of the signal processing unit includes a differential circuit with a first input terminal and a second input terminal for receiving complementary electrical signals corresponding to the optical signal; and an offset voltage setting unit to apply a respective offset voltage to each of the first and second input terminals of the signal processing unit to compensate for temperature dependence of the signal processing unit, the offset voltage setting unit including a first amplifier, a second amplifier and a bias source, wherein the first and second amplifiers are connected in series with each other, the first amplifier includes a differential circuit with two inputs coupled to respective inputs of the offset voltage setting unit, an output of the second amplifier is connected to one of two inputs of the first amplifier, the first amplifier is arranged to operate as a low pass filter, and the bias source is coupled to an input of the second amplifier and arranged to output a bias voltage depending on an operating temperature of the optical receiving unit.

2. The optical receiving unit according to claim 1, wherein said signal processing unit is arranged further to provide a feedback circuit between said input and said output thereof, the feedback circuit including a first feedback element and a second feedback element connected in series with the first feedback element, an element group of the first and second feedback elements being connected between the input and the output of the signal processing unit, and     wherein the offset voltage setting unit is connected with a node commonly connected with the first feedback element and the second feedback element to provide the offset voltages to the input terminals through the first feedback element.

3. An optical transceiver providing an optical transmitting unit and an optical receiving unit, said optical receiving unit comprising:

an O/E-converter for receiving an optical signal and outputting an electrical signal corresponding to said optical signal, the electrical signal being a complementary signal;

a signal processing unit coupled in an AC mode with the O/E-converter for amplifying said electrical signal output from said O/E-converter, the signal processing unit including a differential circuit with a first input terminal and a second input terminal each receiving the complementary signal; and     an offset voltage setting unit for applying a respective offset voltage to each of the first and second input terminals of the signal processing unit, the offset voltage unit including a first amplifier, a second amplifier and a bias source, wherein the first and second amplifiers are connected in series with each other, the first amplifier has a differential circuit with two inputs coupled to respective inputs of the offset voltage setting unit, an output of the second amplifier is connected to one of two inputs of the first amplifier, the first amplifier is arranged to operate as a low pass filter, and the bias source is coupled to an input of the second amplifier and is arranged to output a bias voltage depending on an operating temperature of the optical receiving unit,     wherein each offset voltage is independent of a phase difference between signals in the optical transmitting unit and the optical receiving unit.

4. The optical receiving unit according to claim 3, wherein said signal processing unit further provides a feedback circuit between said inputs and outputs thereof, the feedback circuit including first feedback elements and second feedback elements connected in series with the respective first feedback elements, an element group of the first and second feedback elements being connected between a respective input and output of the signal processing unit, and     wherein the offset voltage setting unit is connected with nodes commonly connected with the first feedback elements and the second feedback elements to provide the offset voltages to the inputs through the first feedback elements.

5. An optical transceiver providing an optical transmitting unit and an optical receiving unit, the optical receiving unit comprising:

an O/E-converter for receiving an optical signal and outputting an electrical signal corresponding to the optical signal;

a signal processing unit coupled in an AC mode with the O/E-converter for amplifying the electrical signal output from the O/E-converter; and     an offset voltage setting unit for providing an offset voltage to the signal processing units the offset voltage unit including a first amplifier, a second amplifier and a bias source, wherein the first amplifier has an input and an output arranged to operate as a low pass filter, the input of the first amplifier is coupled to an input of the offset voltage setting unit, the second amplifier has an input connected to the output of the first amplifier and the bias source, the second amplifier has an output connected to the input of the first amplifier, and the bias source is arranged to output a bias voltage depending on an operating temperature of the optical receiving unit,     wherein the offset voltage compensates for temperature dependence of the signal processing unit and is independent of a phase difference between a signal in the optical transmitting unit and another signal in the optical receiving unit.

6. The optical transceiver according to claim 5 wherein the signal processing unit includes a feedback circuit between an input and an output thereof, the feedback circuit including a first feedback element and a second feedback element connected in series with the first feedback element, an element group of the first and second feedback elements being connected between the input and the output of the signal processing unit, and     wherein the offset voltage setting unit is connected with a node commonly connected with the first feedback element and the second feedback element to provide the offset voltage to the input of the signal processing unit through the first feedback element.

7. The optical transceiver according to claim 5 wherein the offset voltage setting unit provides the offset voltage dependent on an operating temperature of the optical receiving unit.

\* \* \* \* \*